United States Patent
Rasa

(10) Patent No.: US 9,227,150 B2
(45) Date of Patent: Jan. 5, 2016

(54) DEVICE FOR EJECTING DROPLETS OF AN ELECTRICALLY CONDUCTIVE FLUID, VAPOR SUPPRESSING MEANS FOR USE IN SAID DEVICE AND A METHOD FOR SUPPRESSING VAPOR OF AN ELECTRICALLY CONDUCTIVE FLUID

(71) Applicant: OCE-TECHNOLOGIES B.V., Venlo (NL)

(72) Inventor: Mircea V. Rasa, Eindhoven (NL)

(73) Assignee: OCE-TECHNOLOGIES B.V., Venlo (NL)

( * ) Notice: Subject to any disclaimer, the term of this patent is extended or adjusted under 35 U.S.C. 154(b) by 256 days.

(21) Appl. No.: 14/035,666

(22) Filed: Sep. 24, 2013

(65) Prior Publication Data

US 2014/0021268 A1    Jan. 23, 2014

Related U.S. Application Data

(63) Continuation of application No. PCT/EP2012/054956, filed on Mar. 21, 2012.

(30) Foreign Application Priority Data

Apr. 8, 2011    (EP) .................................... 11161658

(51) Int. Cl.
   - *B05B 5/00* (2006.01)
   - *F23D 11/32* (2006.01)
   - *B01D 5/00* (2006.01)
   - *H05K 3/10* (2006.01)

(52) U.S. Cl.
   CPC ................ *B01D 5/0072* (2013.01); *H05K 3/10* (2013.01); *B41J 2202/04* (2013.01); *H05K 2203/0126* (2013.01); *H05K 2203/104* (2013.01); *H05K 2203/105* (2013.01); *H05K 2203/128* (2013.01)

(58) Field of Classification Search
   CPC ...... B05B 5/025; B05B 5/032; B05B 5/1683; B05B 7/1413; B05B 7/1486; B05B 7/1472
   USPC ...................................... 239/690, 708, 690.1
   See application file for complete search history.

(56) References Cited

U.S. PATENT DOCUMENTS 3,246,189 A * 4/1966 Waymouth ...................... 313/13
4,865,642 A    9/1989 Huddleston
(Continued)

FOREIGN PATENT DOCUMENTS

GB            972314      10/1964
WO   WO 2010/063576 A1    6/2010

OTHER PUBLICATIONS

Slade, "Experiments with a simple electrostatic precipitator," XP-002660346, Oct. 2, 2004, Retrieved from the Internet: URL:http://users.skynet.be/BillsPage/Precip2.pdf [retrieved on Sep. 29, 2011].

*Primary Examiner* — Davis Hwu
(74) *Attorney, Agent, or Firm* — Birch, Stewart, Kolasch & Birch, LLP

(57) ABSTRACT

In a device for ejecting droplets of an electrically conductive fluid, a vapor suppressing device is provided to suppress vapor of the electrically conductive fluid. The vapor suppressing device includes an electrode, adapted to provide a direct voltage. Further, a method for suppressing vapor of an electrically conductive fluid in a device for ejecting droplets of an electrically conductive fluid is provided.

14 Claims, 3 Drawing Sheets

(56) References Cited

U.S. PATENT DOCUMENTS

| | | | |
|---|---|---|---|
| 5,280,851 A | 1/1994 | Neukum | |
| 6,021,965 A * | 2/2000 | Hartle | 239/706 |
| 6,375,094 B1 * | 4/2002 | Schroeder et al. | 239/113 |
| 8,282,028 B2 * | 10/2012 | Nakada et al. | 239/690.1 |
| 2010/0242683 A1 | 9/2010 | Yamaki et al. | |

* cited by examiner

DEVICE FOR EJECTING DROPLETS OF AN ELECTRICALLY CONDUCTIVE FLUID, VAPOR SUPPRESSING MEANS FOR USE IN SAID DEVICE AND A METHOD FOR SUPPRESSING VAPOR OF AN ELECTRICALLY CONDUCTIVE FLUID

CROSS-REFERENCE TO RELATED APPLICATIONS

This application is a continuation of PCT International Application No. PCT/EP2012/054956 filed on Mar. 21, 2012, which claims priority under 35 U.S.C 119(a) to Application No. 11161658.7 filed Apr. 8, 2011 in Europe, all of which are hereby expressly incorporate by reference into the present application.

The present invention relates to a device for ejecting droplets of an electrically conductive fluid and more in particular to a device for ejecting droplets of an electrically conductive fluid further comprising vapor suppressing means for suppressing vapor of the electrically conductive fluid. In another aspect, the invention relates to a vapor suppressing means for use in said device for ejecting droplets of an electrically conductive fluid and to a method for suppressing vapor of an electrically conductive fluid.

BACKGROUND OF THE INVENTION

A printing device for ejecting droplets of an electrically conductive fluid such as a molten metal is known. Such a device may be used for ejecting droplets of a fluid having a high temperature, such as a molten metal or a molten semiconductor.

An example of such a device is described in WO 2010/063576 A1. The device according to WO 2010/063576 A1 comprises a fluid chamber, adapted to contain the electrically conductive fluid and may be used for direct printing of molten metals. In WO 2010/063576 A1, it is described that droplets of the molten electrically conductive fluid are expelled through an orifice of the printing device by generating a Lorentz force in the electrically conductive fluid. Direct printing of molten electrically conductive fluids, such as molten metals may be employed for printing electronic circuits, for example.

However, often, electrically conductive fluids, such as molten metals, release a significant amount of vapor, even at temperatures slightly above the melting temperature. These vapors may be harmful. For example, these vapors may have a strong negative effect on the human health, in case these vapors are inhaled. Second, vapors that precipitate outside of a reservoir or outside of the print head may cause damage to equipment and cause pollution of the system. For example, precipitation of the electrically conductive fluid may hamper the process. The printing process takes place at elevated temperatures. Therefore, the electrically conductive fluid has to be heated. Often, this is done by inductive heating, wherein a induction heating coil is placed around a reservoir comprising the electrically conductive fluid. In case the vapor of the electrically conductive fluid precipitates between the induction heating coil and the reservoir, heating may be hindered and the printing process may be hampered. Moreover, evaporation of the electrically conductive fluid leads to loss of material. This is unwanted, especially if the electrically conductive fluid is an expensive material. Therefore, it is desirable to prevent the vapors of the electrically conductive fluid from escaping from the electrically conductive fluid material reservoir, such as a fluid chamber, into the environment.

It is an object of the invention to mitigate the above problems.

SUMMARY OF THE INVENTION

The above object is achieved in a device for ejecting droplets of an electrically conductive fluid, the device comprising:
- a fluid chamber body defining a fluid chamber and having an orifice extending from the fluid chamber to an outer surface of the fluid chamber body and the fluid chamber being adapted to comprise the electrically conductive fluid; and,
- an actuation means for ejecting a droplet of the electrically conductive fluid from the fluid chamber and through the orifice;
- a vapor suppressing means for suppressing vapor of the electrically conductive fluid, said vapor suppressing means comprising a vapor suppressing electrode, the vapor suppressing electrode being adapted to provide a direct voltage.

The device according to the present invention comprises a fluid chamber body defining a fluid chamber and having an orifice extending from the fluid chamber to an outer surface of the fluid chamber element. The fluid chamber is adapted to comprise the electrically conductive fluid. The fluid chamber body comprises an orifice, the orifice extending from the fluid chamber to an outer surface of the fluid chamber body. Hence, a droplet of fluid may be ejected from the fluid chamber body via the orifice. The device according to the present invention also comprises actuation means. The actuation means may be any kind of actuation means, such as, but not limited to, a piezoelectric actuator or means for actuating a droplet of the electrically conductive fluid by applying a Lorentz force.

The fluid chamber body is preferably made of a material, which is cost effectively machinable. The material for the fluid chamber body may be selected from, but is not limited to graphite, boron-nitride or silicon. When the fluid chamber body is made from silicon, the fluid chamber body may be made using etching techniques, for example. Alternatively, the fluid chamber body may be formed starting from a molten material which is poured into a mould, is cooled down such that the molten material solidifies. Afterwards, the mould may be removed yielding the fluid chamber body. In another embodiment, at least a part of the fluid chamber body may be made from a solid piece, using a mechanical technique, such as milling, drilling, sawing or the like, or a chemical technique, such as etching or the like. The fluid chamber body may be made out of one piece or may be assembled starting from a plurality of pieces using a suitable assembly technique, such as welding, gluing, nailing or the like.

Depending on the type of electrically conductive fluid, such as a molten metal or a molten semiconductor to be jetted, the fluid chamber body may need to be heat resistant. Preferably the body is resistant to temperatures up to 3000 K, which enables to handle a large range of electrically conductive materials. Also, it may be preferred that the material is resistant against corrosion by the electrically conductive fluids. Furthermore, the material of the fluid chamber, in particular at the orifice, is wettable by the fluid. If the fluid does not wet on the material, the fluid will contract itself and bead and consequently will not flow through the orifice when no (external) force is exerted on the fluid. By ensuring that the fluid chamber body is wettable by the fluid, the fluid will flow into the orifice without an additional force.

In an embodiment, the material of the fluid chamber body is not electrically conductive. This may be advantageous for preventing an electrical actuation current flowing into the fluid chamber body, since such a flow into the body material might decrease a generated actuation force. In a particular embodiment, the fluid chamber body comprises boron-nitride (BN).

The device according to the present invention further comprises vapor suppressing means. Electrically conductive fluids may generate vapor. For example, in a molten metal, the metal is present as a collection of ions and electrons. The ions are positively charged. Therefore, it is assumed that evaporation of the molten metal takes place in the form of electrons and (positively charged) ions. Electrons carry a negative electric charge. The positively charged ions carry a positive charge. Therefore, the electrically conductive fluid also is electrically conductive in the vapor phase.

It may be desirable to suppress this vapor, for example for the reasons stated above. For example, it may be desired to suppress a vapor comprising electrically charged particles when a induction heating coil is placed around a reservoir comprising the electrically conductive fluid. An electrical current may flow through the induction coil. As a consequence, charged particles that are present in proximity of the induction coil may be attracted to the coil and may precipitate thereon. This may hamper the efficiency of heating by the induction coil. Therefore, it is desirable to suppress vapor comprising electrically charged particles.

To prevent vapor of the electrically conductive fluid from escaping from the electrically conductive fluid material reservoir, vapor suppressing means may be applied. The vapor suppressing means comprise at least a vapor suppressing electrode. By applying a voltage between the vapor suppressing electrode and the electrically conductive fluid, an electrical field may be generated in the vapor present in the surroundings of the vapor suppressing electrode. The electrical field provides a force to charged particles, such as ions and electrons, under influence of which force the charged particles move. Depending on the direction of the electrical field and the charge of the particles, the particles forming the vapor of the electrically conductive fluid may be attracted towards an electrode, or may be repelled by the electrode. For example, if the vapor suppressing electrode is an anode, positively charged particles are repelled by the electrode. Thus, positively charged metal ions may be repelled by the vapor suppressing electrode. When the vapor suppressing electrode is suitably positioned with respect to the fluid chamber body comprising the electrically conductive fluid, metal ions evaporated from the fluid may be pushed back towards the fluid, resulting in the suppression of vapor of the molten metal. When suppressing the vapor, the vapor is prevented to spread any further and is thus prevented to contaminate the environment. When the vapor suppression electrode is a anode, electrons present in the vapor may be attracted toward s the electrode. This may lead to the generation of an electrical current. Thus, applying a voltage between the vapor suppression electrode and the electrically conductive fluid may result in the generation of an electrical current.

An electrically conductive fluid is a fluid that, in the vapor phase, has an electric conductivity that is sufficient for the particles forming the vapor to be attracted towards or to be repelled from the vapor suppressing electrode. Thus, whether or not a fluid is an electrically conductive fluid in accordance with the present invention depends on the electrical conductivity of the material forming the fluid, the pressure and temperature of the vapor and the magnitude of the current provided by the vapor suppressing electrode, for example. Therefore, the material forming the fluid is considered electrically conductive in accordance with the present invention if the vapor formed by evaporation of the electrically conductive fluid (during jetting of droplets of the electrically conductive fluid) may be efficiently attracted to or repulsed by the vapor suppressing means comprising the vapor suppressing electrode in operation of the device for ejecting droplets of an electrically conductive fluid.

Moreover, the electrically conductive fluid is a fluid having an electric conductivity that is sufficient to generate a Lorentz force that is strong enough to eject a droplet of the fluid through the orifice, upon applying a certain current, in a given magnetic field and geometry of the fluid chamber body. Therefore, whether a fluid is an electrically conductive fluid in accordance with the present invention should be determined taking into account the conditions, for example the current and the magnetic field applied and on the geometry of the fluid chamber body.

As stated above, it is assumed that evaporation of the molten electrically conductive fluid takes place in the form of negatively charges particles and positively charged particles. These may be attracted towards or repelled by the vapor suppression electrode. However, there is a possibility that recombination of (a part of) the positively and negatively charged particles takes place, leading to the formation of neutrally charged particles. These neutrally charged particles may not move under the influence of the electrical field, generated by applying a voltage between the vapor suppression electrode and the electrically conductive fluid, thereby reducing the efficiency of the vapor suppression. Therefore, it is advantageous to prevent formation of the neutrally charged particles. This may be done by suitably selecting the voltage applied between the vapor suppression electrode and the electrically conductive fluid, such that the voltage is equal to or higher then the discharge potential of the material of the electrically conductive fluid. The discharge potential is the potential (voltage) at which an atom or atom group loses an electron and is ionized. The discharge potential depends not only on the material used, but also, for example, on the pressure, temperature and distance between the electrode and the electrically conductive fluid. In addition, the discharge potential also depends on the composition of the environment of the vapor of the electrically conductive fluid; the discharge potential of the vapor in case the vapor comprises only the particles of the vapor of the electrically conductive fluid differs from the case wherein the particles from the electrically conductive fluid are diluted with an inert gas. Moreover, the discharge potential of a mixture of particles from the electrically conductive fluid and inert gas differs from the discharge potential of a mixture of particles from the electrically conductive fluid, an inert gas and a reducing gas, such as carbon monoxide or hydrogen.

Alternatively, ionization of a vapor may also take place under influence of radiation, such as e.g. X-rays or UV-radiation.

In an embodiment, the electrically conductive fluid comprises a molten metal or a molten semiconductor. Metals and semiconductors are materials that in general have a good electric conductivity. For example, ejecting droplets of a molten metal using a device according to the present invention, may be used to print electronic circuits. By applying a printing technique to apply droplets of metal onto a receiving medium, electronic circuits may be printed in a versatile way; i.e. the shape of the circuit may be easily adapted by applying a printing technique. However, vapor of a molten metal may be harmful, for example for the human health or it may damage the equipment, when precipitating onto (a part of the) jetting device.

In an embodiment, the device further comprises heating means for heating the electrically conductive fluid. It may be necessary to heat the fluid, in order for the fluid to be jetted. For example, the viscosity of the fluid at ambient temperature may be too high for the fluid to be jetted properly. Therefore, it may be necessary to decrease the viscosity of the fluid by heating the fluid. Moreover, the fluid may be supplied to the jetting device as a solid material, that is melted and thereby forms the electrically conductive fluid. In order to melt the solid material, the solid material needs to be heated by the heating means, thereby providing the electrically conductive fluid.

In an embodiment, the actuation means comprises an actuating electrode for actuating the electrically conductive fluid. As mentioned above, different types of mechanism can be used. The function and design of the actuation means need to be adjusted to the type of actuation that is used to eject droplets of the fluid through the orifice. In this embodiment, the actuation means comprises at least an actuating electrode. The actuation means is configured to actuate the electrically conductive fluid.

In an embodiment, the actuation means further comprise a magnet for providing a magnetic field in at least a part of the electrically conductive fluid. When the actuation means comprise both an actuating electrode and a magnet, it may be possible to actuate the electrically conductive fluid by generating a Lorentz force in the fluid. In order to be able to generate a Lorentz force in the electrically conductive fluid, the magnet should be positioned such, that at least a part of the electrically conductive fluid is positioned in a magnetic field, provided by the magnet. The actuating electrode is positioned such, that an electric current may be provided to the electrically conductive fluid positioned in the magnetic field. By applying an electric current to the electrically conductive fluid that is positioned in a magnetic field, a Lorentz force is generated in the electrically conductive fluid, as the Lorentz force is related to the electric current and the magnetic field vector; $\vec{F}=\vec{I}\times\vec{B}$. The Lorentz force may generate a volume force in the electrically conductive fluid, causing a motion in the electrically conductive fluid. This motion causes differences in pressure throughout the electrically conductive fluid, also known as a pressure wave. The motion in the electrically conductive fluid may result in the ejection of a droplet of this fluid through the orifice.

In an embodiment, the device further comprises means for applying an alternating voltage, said means for applying an alternating voltage being configured to, in operation, provide an alternating voltage in the vapor of the electrically conductive fluid for suppressing said vapor of the electrically conductive fluid.

The vapor suppressing means as mentioned above comprises a vapor suppressing electrode that is adapted to provide a direct voltage. The direct voltage provides a constant electrical field, under influence of which the charged electrons and ions present in the vapor may move, thereby suppressing the vapor. However, the charged particles in the vapor phase, such as electrons and positively charged ions may recombine in the vapor phase, generating electrically neutral particles. As explained above, these neutral particles may not move under the influence of the electrical field, provided by the direct voltage. To improve the vapor suppressing, a device may be provided, further comprising means for applying an alternating voltage. The alternating voltage may be for example an RF voltage, wherein the frequency is in the range of 100 kHz to 100 MHz. Preferably, the frequency is in the range of 10 MHz to 50 MHz. By applying an alternating voltage over the vapor phase, a disruptive discharge may be provided. Because of the disruptive discharge, a plasma, containing particles carrying a negative electrical charge, such as electrons or anions, and particles carrying a positive electrical charge, such as cations, may be formed from the neutral particles. Thus, in case the positively charged and negatively charged particles in the vapor phase recombine, thereby forming neutral particles, then the application of an alternating voltage may result in the reformation of the positively and negatively charged particles. These charged particles may move under the influence of the electrical field provided over the vapor phase and the vapor of the electrically conductive fluid may thus be suppressed. In summary, an even improved vapor suppressing effect may be obtained when applying an alternating voltage in addition to providing a direct voltage.

In an embodiment, the vapor suppressing electrode is configured to, in operation, float on a fluid surface of the electrically conductive fluid. In operation, the fluid chamber of the device for ejecting droplets of an electrically conductive fluid, adapted to comprise the electrically conductive fluid is at least partially filled with the electrically conductive fluid. The electrically conductive fluid has a fluid surface directed towards the vapor suppressing electrode. In this embodiment, the vapor suppressing electrode is configured to float on the liquid surface of the electrically conductive fluid directed towards the vapor suppressing electrode. By configuring the electrode to float on the surface of the fluid, the distance between the surface of the fluid and the electrode is minimized. Evaporation of the electrically conductive fluid takes place at the surface of the electrically conductive fluid. It is believed that reduction of the distance between the surface of the electrically conductive fluid and the vapor suppressing electrode, thereby reducing the distance between the vapor suppressing electrode and the charged particles evaporating from the electrically conductive fluid at the fluid surface, increases the electrical field and thereby increases the attractive or repulsive force, experienced by the charged particle. Moreover, the shorter the distance between the fluid surface and the vapor suppressing electrode, the less time the charged particles have to recombine with a particle of opposite charge, generating neutral particles that are not attracted or repulsed by the vapor suppressing electrode.

When, in operation, the electrically conductive fluid is ejected from the fluid chamber body through the orifice, the liquid level in the fluid chamber body lowers. Since, in this embodiment, the electrode floats on the electrically conductive fluid, the distance between the surface of the fluid and the electrode may be kept constant. As a consequence, during the entire jetting process, the repulsive or attractive force, caused by the electrical field, experienced by the charged particles in the vapor may not decrease during jetting and chances of recombination stay low.

In an embodiment, the vapor suppressing means further comprises a corona. The corona comprises a (set of) corona electrode(s) that is capable of generating a corona discharge in the electrically conductive vapor. One of the corona electrodes is a highly curved electrode, such as an electrode that has the shape of the tip of a needle. Another corona electrode is an electrode of low curvature, for example a plate. When the highly curved corona electrode is the cathode and the corona electrode of low curvature is the anode, then a negative corona may be provided. Alternatively, when the highly curved corona electrode is the anode and the corona electrode of low curvature is the cathode, then a positive corona may be provided, as is known in the art. Without wanting to be bound to any theory, it is believed that by applying a corona in the electrically conductive vapor, the particles in the vapor may be ionized and a plasma may be generated. The particles (ions) present in the plasma carry an electrical charge, either positive or negative. The particles carrying a negative electrical charge move to the anode and the particles carrying a positive electrical charge move to the cathode. In case recombination of the electrons and positively charge particles had taken place, neutrally charged particles may have been formed in the vapor phase. Neutrally charged particles are not attracted by an electrode. By applying a corona, a plasma comprising negatively and positively charged particles may be formed from the neutrally charged particles. The negatively and positively charged particles may be attracted by an electrode and thus, vapor may be successfully suppressed.

In an embodiment, the device further comprises filter means for filtering the vapor of the electrically conductive fluid. The vapor suppressing means may not suppress the vapor of the electrically conductive fluid with 100% efficiency. For example, this may result from recombination of electrons and cations in the vapor phase, resulting in neutrally charged particles, that are not attracted by any of the electrodes present. Moreover, larger particles may form, for example particles comprising a plurality of neutrally charged atoms. To further suppress the vapor, an additional filter means may be provided, for filtering the particles, forming the vapor of the electrically conductive fluid. Examples of filter means may be a cooled filter, wherein particles are condensed from the vapor phase. Alternatively, the filter means may comprise a porous material, comprising pores and/or channels wherein particles from the electrically conductive vapor may be trapped.

In an aspect of the invention, a vapor suppressing means for suppressing vapors of an electrically conductive fluid is provided, the vapor suppressing means comprising a vapor suppressing electrode, the vapor suppressing means being adapted to be incorporated into a device for ejecting droplets of an electrically conductive fluid, the device for ejecting droplets of an electrically conductive fluid comprising:
   a fluid chamber body defining a fluid chamber and having an orifice extending from the fluid chamber to an outer surface of the fluid chamber body and the fluid chamber being adapted to comprise the electrically conductive fluid; and,
   an actuation means for ejecting a droplet of the electrically conductive fluid from the fluid chamber and through the orifice.

When jetting droplets of an electrically conductive fluid, the electrically conductive fluid may partially evaporate, generating an electrically conductive vapor. This vapor may be harmful. It may for example be harmful to the environment or to the human health. Alternatively, vapor may precipitate on the device for jetting droplets of an electrically conductive fluid, causing damage to the device. The vapor suppressing means may suppress the vapor of the electrically conductive fluid, thereby preventing damage to the device and to the environment and/or human health.

In a further aspect of the invention, the invention comprises a method for suppressing vapor of an electrically conductive fluid in a device for ejecting droplets of an electrically conductive fluid, the device comprising
   a fluid chamber body defining a fluid chamber and having an orifice extending from the fluid chamber to an outer surface of the fluid chamber body and the fluid chamber being adapted to comprise the electrically conductive fluid;
   a vapor suppressing means for suppressing vapor of the electrically conductive fluid, said vapor suppressing means comprising a vapor suppressing electrode;

the method comprising the steps of:
   a) supplying the electrically conductive fluid to the fluid chamber of the device;
   b) applying a direct voltage to the vapor suppressing electrode for suppressing the vapor of the electrically conductive fluid.

In a device for jetting droplets of an electrically conductive fluid, a part of the fluid may evaporate. Vapor of an electrically conductive fluid, such as metal vapor or vapor of a semiconductor may be harmful to health, environment and equipment. By providing a vapor suppressing electrode, the vapor of the electrically conductive fluid may be suppressed, thereby decreasing the adverse effects caused by the vapor of the electrically conductive fluid.

In an embodiment, step a) is preceded by the step of: supplying a solid material to the device, said solid material, upon melting, forming the electrically conductive fluid. The conditions, such as temperature, pressure, etc, under which a material to be jetted by a device according to the present invention, is supplied to the fluid chamber of the device, may not be the conditions at which the material to be jetted is fluid. Instead, the material may be solid under these conditions. In that case, the solid material is melted after it has been supplied to the fluid chamber of the device. By melting the solid material the electrically conductive fluid is formed. It may be more practical, especially if the material forming the electrically conductive fluid has a relatively high melting point, to supply the material to the device in a solid state and subsequently forming the electrically conductive fluid from the material by melting the material, than by applying the material to the device in a fluid state.

In an embodiment, the method further comprises:
   c) heating the electrically conductive fluid. The temperature of a fluid may determine the properties of the fluid, such as viscosity, density or the like. These properties influence the behavior of the fluid when the fluid is jetted. Moreover, some materials may not be fluid at ambient temperature and therefore, need to be heated in order to be jetted. Thus, it is important to suitably influence the temperature of the fluid by heating the electrically conductive fluid.

In an embodiment, the method further comprising:
   d) applying an alternating voltage over the vapor of the electrically conductive fluid. As explained above, applying an alternating voltage may improve the suppression of the electrically conductive vapor.

In an embodiment, the method further comprises:
   e) filtering the vapor of the electrically conductive fluid using filtering means. By filtering the vapor, an additional means is provided for improving the efficiency of the vapor suppression and for filtering particles from the vapor phase that may not be suppressed by the vapor suppressing electrode.

BRIEF DESCRIPTION OF THE DRAWINGS

These and further features and advantages of the present invention are explained hereinafter with reference to the accompanying schematic drawings showing non-limiting embodiments and wherein.

DETAILED DESCRIPTION OF THE DRAWINGS

Figure 1A:
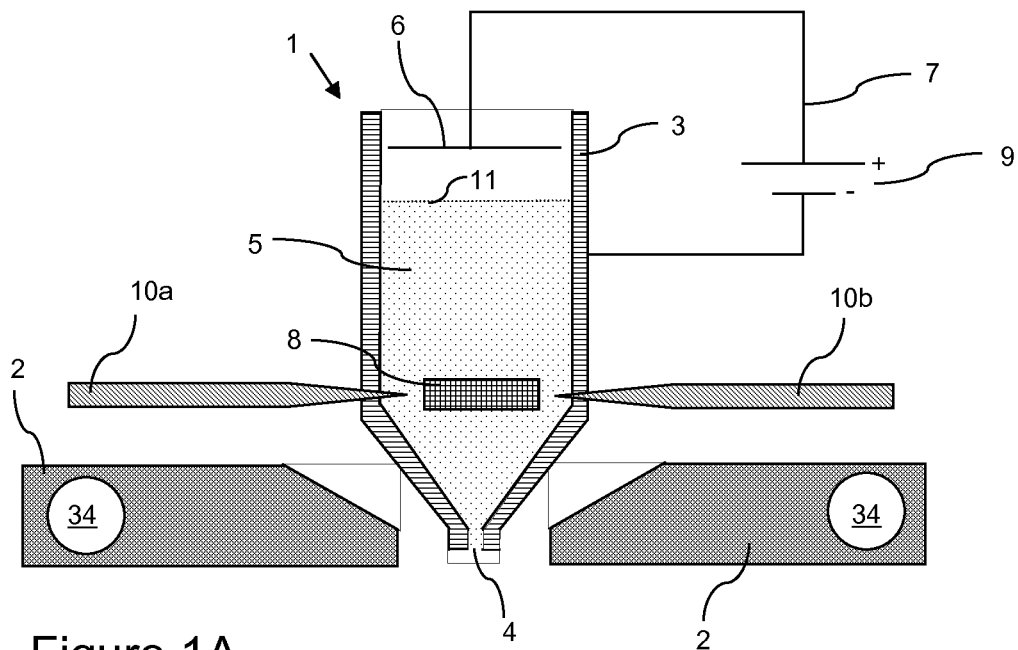
FIG. 1A shows a cross-sectional view of an embodiment of the device for ejecting droplets of an electrically conductive fluid.

In the drawings, same reference numerals refer to same elements.

FIG. 1A shows a cross-sectional view of a part of a device 1 for ejecting droplets of an electrically conductive fluid, for example a molten metal or a molten semiconductor.

The device for ejecting droplets 1 is provided with an orifice 4 through which a droplet of the fluid may be ejected. The orifice 4 is a through hole extending through a wall of a fluid chamber body 3. In the fluid chamber body 3 a fluid chamber is arranged. The fluid chamber 3 is configured to hold the electrically conductive fluid. In case the fluid to be ejected is a molten metal or a molten semiconductor, ejection of droplets of the fluid typically takes place at a high temperature. For example, the melting point of copper is 1085° C., the melting point of silver is 962° C. In that case, the fluid chamber body 3 needs to be heat resistant. Also, an inner wall of the through hole forming the orifice 4 needs to be wetting for the fluid in order to enable the fluid to flow through the orifice 4. If the surface of the fluid chamber body 3 is wetting with respect to the fluid, the fluid will not tend to form beads, but will easily spread and flow over the surface and is thus enabled to flow into and through the orifice 4.

Several techniques may be applied for actuating the electrically conductive fluid, such as piezoelectric actuation or thermal actuation. The device shown in FIG. 1A, comprises actuating electrodes 10a, 10b and a magnet 8 as actuation means. The magnet 8 may be applied to provide a magnetic field. The actuating electrodes 10a, 10b may be applied to apply an electric current to the electrically conductive fluid. As explained above, providing a current through an electrically conductive fluid that is placed in a magnetic field, results in the generation of a Lorentz force in the fluid. Thus, in the device shown in FIG. 1A, the electrically conductive fluid may be actuated by Lorentz actuation. For applying a Lorentz force in the conductive medium, the jetting device 1 is provided with a permanent magnets 8. More than one magnet may be applied. Optionally, the magnet 8 may be arranged between magnetic field concentrating elements (not shown), for example magnetic field concentrating elements made of a magnetic field guiding material such as iron. The jetting device 1 is further provided with two actuating electrodes 10a, 10b (hereinafter also referred to as actuating electrodes 10) both extending into the fluid chamber body 3 through a suitable through hole such that at least a tip of each of the actuating electrodes 10 is in direct electrical contact with the conductive medium present in the fluid chamber 3. The actuating electrodes 10 are each operatively connected to a suitable electrical current generator (not shown) such that a suitable electrical current may be generated through the electrodes 10 and the electrically conductive fluid present between the tips of the electrodes 10. Optionally, the magnets 8 may be cooled by suitable cooling means.

The electrodes 10 are made of a suitable material for carrying a relatively high current, and optionally, for being resistant against high temperatures. The electrodes 10 may be suitably made of tungsten (W), although other suitable materials are contemplated.

FIG. 1A further shows a vapor suppressing electrode 6. In FIG. 1A, the vapor suppressing electrode 6 is embodied as a flat electrode that is positioned parallel to the surface 11 of the electrically conductive fluid. Evaporation of the electrically conductive fluid, thereby forming an electrically conductive vapor takes place at a surface of the electrically conductive fluid. As a consequence, in order to efficiently suppress the vapor of the electrically conductive fluid, it is preferred that the vapor suppressing means, including the vapor suppressing electrode 6 are positioned in close proximity to the place where the electrically conductive vapor is generated, i.e. the surface 11 of the electrically conductive fluid.

The vapor suppressing electrode 6 is connected to a power supply 9 via an electric circuit 7, to which a direct voltage is provided. A second electrode may be connected to the fluid chamber body 3. By providing a direct voltage to the electric circuit 7, a constant voltage is provided between the vapor suppressing electrode 6 and the surface 11 of the electrically conductive fluid. In between the vapor suppressing electrode 6 and the surface 11 of the electrically conductive fluid, electrically conductive vapor may be present (not shown). The electrically conductive vapor may comprise of electrically charged particles, such as electrons and positively charged ions (cations), or any other type of positively and negatively charged particles. The voltage that is applied to the electrically conductive fluid results in the generation of an electrical field. The vapor suppressing electrode 6 as depicted in FIG. 1A is a vapor suppression cathode. The cathode attracts negatively charged particles, such as electrons or anions. Positively charged particles, such as cations, for example metal ions such as copper cations ($Cu^+$, $Cu^{2+}$), silver cations ($Ag^+$), gold cations ($Au^+$), or any other metal cation, are repelled from the cathode. In the configuration of the vapor suppressing electrode 6 and the fluid chamber body 3 shown in FIG. 1A, repelling the positively charged particles from the vapor suppressing electrode 6 results in forcing the positively charged particles back to the electrically conductive fluid. As a consequence, electrically conductive vapor is prevented to escape from the electrically conductive fluid. Therefore, presence of vapor of the electrically conductive fluid in the surroundings of the device for ejecting droplets of the electrically conductive fluid is prevented.

Figure 1B:
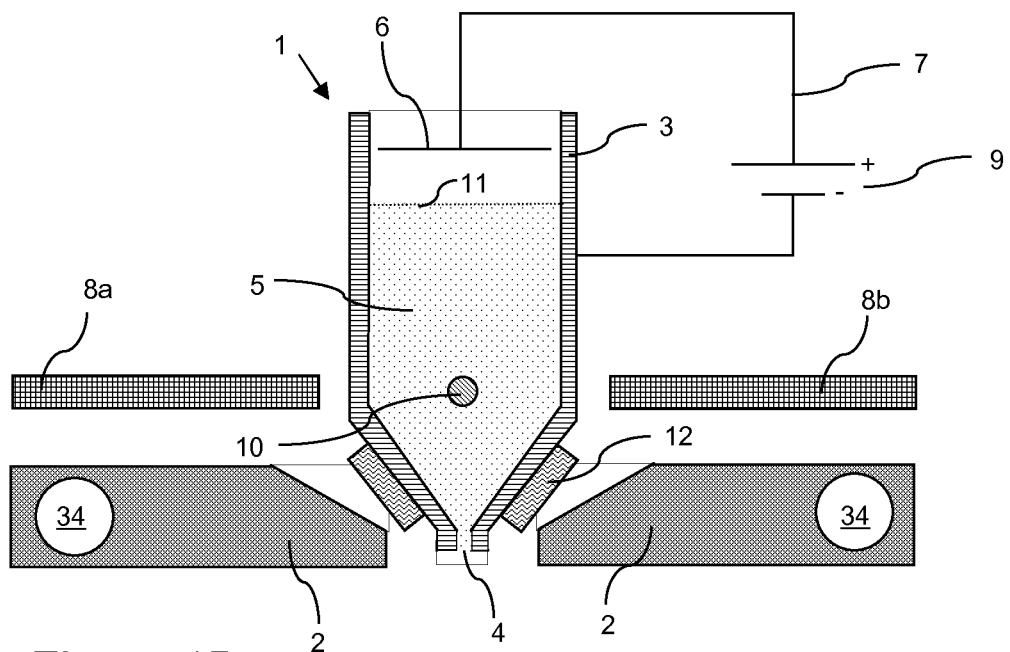
FIG. 1B shows a second cross-sectional view of an embodiment of the device for ejecting droplets of an electrically conductive fluid.

FIG. 1B shows a cross-sectional view of the device as shown in FIG. 1A, wherein the cross-section is shown at a position turned 90° with respect to the cross-sectional view of FIG. 1A. In contrast to FIG. 1A, two magnets 8a, 8b (now referred to as magnets 8) are visible. The two magnets 8 are positioned perpendicular with respects to the two actuating electrodes 10. In FIG. 1B, the actuating electrodes 10 are positioned perpendicular with respect to the cross-section. The actuating electrodes 10 and the magnets 8 are positioned perpendicular with respect to one another to maximize the Lorentz force obtained when applying a current to the electrically conductive fluid, placed in the magnetic field. FIG. 1B also shows the vapor suppressing electrode 6 connected to the electric circuit 7.

Figure 1C:
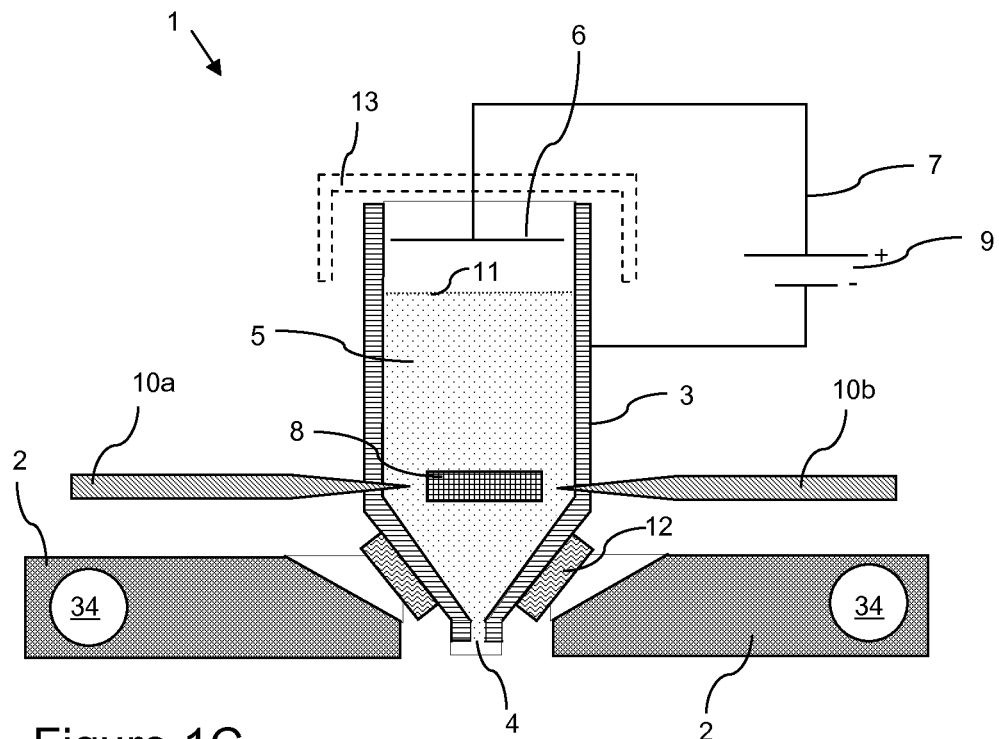
FIG. 1C shows a cross-sectional view of a further embodiment of the device for ejecting droplets of an electrically conductive fluid.

FIG. 1C shows a cross-sectional view of the device as shown in FIG. 1A, wherein the device is further provided with heating means for heating the electrically conductive fluid and/or keeping the fluid at a predetermined temperature. The heating means 12 may heat the electrically conductive fluid directly or may heat the fluid chamber body 3, containing the electrically non-conductive medium, as shown in FIG. 1C. The heating means 12 may be electrical heating means, inductive heating means or a flame, for example. In an embodiment, the electrically conductive fluid comprises a molten metal or a molten semiconductor. Usually metals or semiconductors have a melting point, that is above room temperature. For example, the melting points of copper, gold, titanium, iron, and germanium are 1085° C., 1064° C., 1668° C., 1538° C., 938° C. respectively. Thus, heating means are necessary to keep these materials in a molten state. In an embodiment, the electrically conductive fluid is provided to the fluid chamber as a solid material, the solid material upon melting, forming the electrically conductive fluid. In order to melt the solid material, heating means 12 are provided.

FIG. 1C further shows filter means 13. The filter means are schematically depicted as dashed lines. It will be clear to the person skilled in the art, that the filter means 13 should be selected such that the filter means efficiently filter the particles forming the electrically conductive fluid from the atmosphere surrounding the filter means. The filter means 13 may optionally comprise cooling means (not shown). By cooling the electrically conductive vapor, the electrically conductive vapor may condense, forming an electrically conductive fluid, thereby suppressing the electrically conductive vapor.

Figure 2:
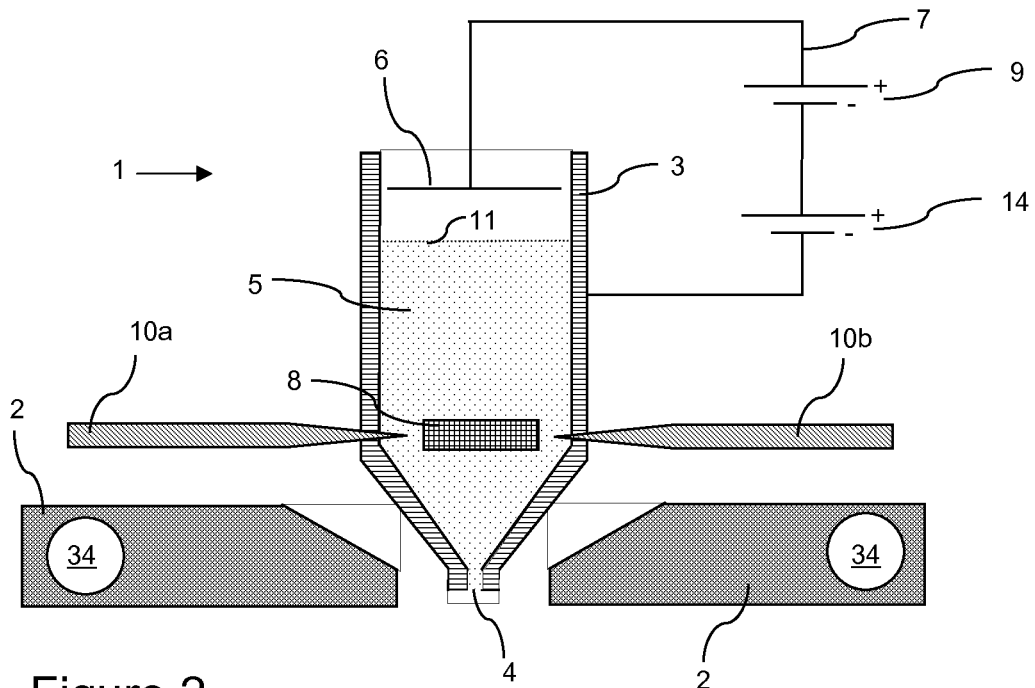
FIG. 2 shows a cross-sectional view of a further embodiment of the device for ejecting droplets of an electrically conductive fluid.

FIG. 2 shows a further embodiment of the device for ejecting droplets of an electrically conductive fluid. The device shown in FIG. 2 is provided with vapor suppressing electrode 6. The vapor suppressing electrode 6 is connected to a first power source 9 and a second power source 14 via electric circuit 7. The first power source 9 provides a direct voltage, whereas the second power source provides an alternating voltage. By using both the first power source 7 and the second power source 14, both a direct voltage (a constant voltage) and an alternating voltage may be applied between the surface 11 of the electrically conductive fluid and the vapor suppressing electrode 6 at the same time. The constant voltage provides a constant driving force for charged particles to move with respect to the vapor suppressing electrode 6, thereby generating a current. However, as explained above, recombination of positively charged particles and negatively charged particles, leading to the formation of neutrally charged particles may take place. Neutrally charged particles may not move with respect to the vapor suppressing electrode 6. As a consequence, the efficiency of the vapor suppression may decrease.

The alternating voltage, provided over the vapor phase, between the vapor suppressing electrode 6 and the surface 11 of the electrically conductive fluid. may provide a disruptive discharge. Because of the disruptive discharge, a plasma, containing particles carrying a negative electrical charge, such as electrons or anions, and particles carrying a positive electrical charge, such as cations, may be formed from the neutral particles. The charged particles may be attracted towards the vapor suppressing electrode 6 or towards the surface 11 of the electrically conductive fluid. Thus, by applying an alternating voltage next to a direct voltage, the efficiency of the vapor suppression may be increased.

Figure 3:
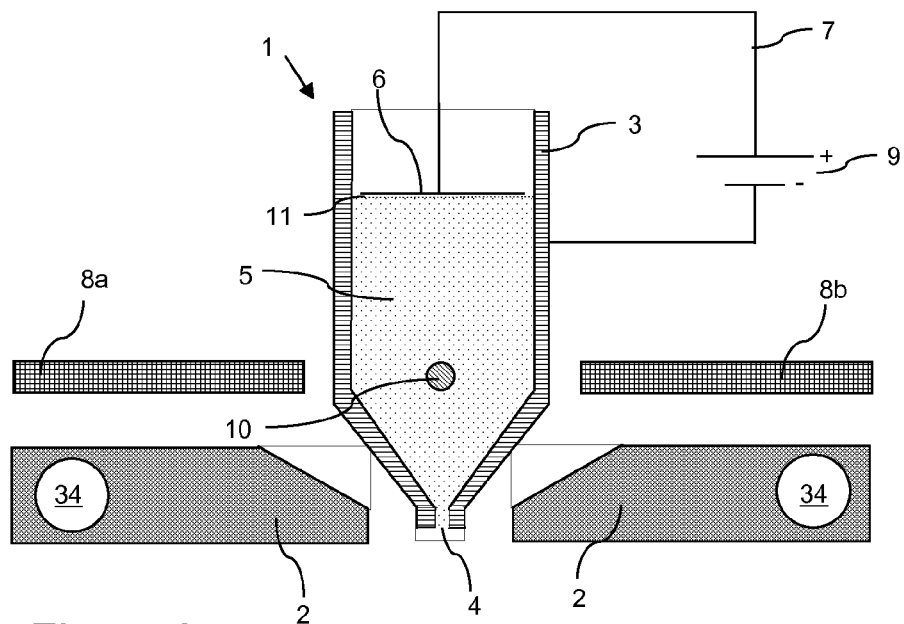
FIG. 3 shows a cross-sectional view of another embodiment of the device for ejecting droplets of an electrically conductive fluid.

FIG. 3 shows another embodiment of the device for ejecting droplets of an electrically conductive fluid. The device shown in FIG. 3 is provided with the vapor suppressing electrode 6, wherein the vapor suppressing electrode 6 is adapted to float on the fluid surface 11 of the electrically conductive fluid. By providing a vapor suppressing electrode 6 that floats on the fluid surface 11 of the electrically conductive fluid, the distance between the fluid surface 11 and the vapor suppressing electrode 6 may be kept at a constant value and is very small. Because the vapor suppressing electrode is kept at a very small distance from the fluid surface 11, particles evaporating from the electrically conductive fluid may only need to travel a small distance, in order to reach the electrode. The small distance between the vapor suppressing electrode 6 and the fluid surface 11 may improve suppression of the electrically conductive vapor, as explained above.

In order to provide a vapor suppressing electrode 6 that is embodied as a floating vapor suppressing electrode 6, the vapor suppressing electrode 6 has to be arranged movable with respect to the fluid chamber body 3, using suitable positioning means. In an embodiment, the vapor suppressing electrode 6 may be able to move with respect to the fluid chamber body 3. Alternatively, the fluid chamber body 3 may be movably arranged with respect to the vapor suppressing electrode 6. The positioning means (not shown) for movably arranging the vapor suppressing electrode 6 and the fluid chamber body 3 with respect to one another may comprise a first holder for holding the vapor suppressing electrode 6 and a second holder for holding the fluid chamber body 3. The positioning means may further comprise moving means for moving the vapor suppressing electrode 6 and the fluid chamber body 3 with respect to one another. The positioning means may comprise for example, a worm wheel, a linear servo controlled motor or pneumatic actuation between the holder the first and the second holder. Appropriate positioning means may be suitably connected.

Figure 4:
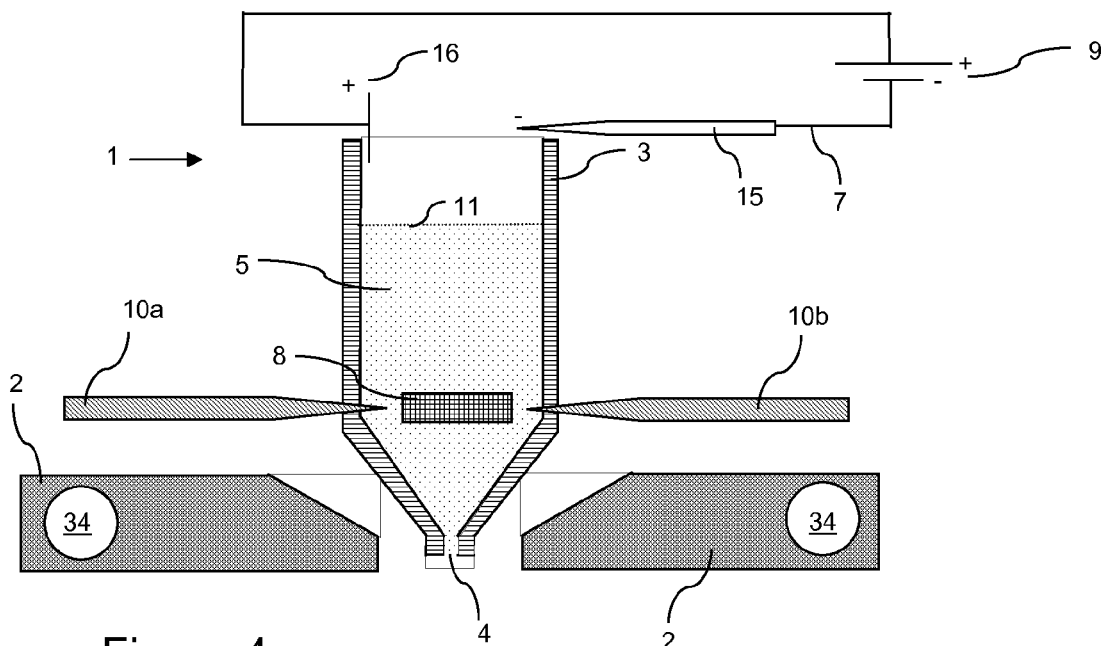
FIG. 4 shows a cross-sectional view of another embodiment of the device for ejecting droplets of an electrically conductive fluid.

FIG. 4 shows another embodiment of the device for ejecting droplets of an electrically conductive fluid. The vapor suppressing means are embodied as a first vapor suppressing electrode 15 and a second vapor suppressing electrode 16. The first and the second vapor suppressing electrodes 15, 16 are both connected to the power source 9 via the electric circuit 7. The first vapor suppressing electrode 15 is a highly curved electrode, such as a sharp cathode. The second vapor suppressing electrode 16 is an electrode of low curvature, such as a plate. In the embodiment shown in FIG. 4, the second vapor suppressing electrode 16 is an anode. The first and the second vapor suppressing electrodes 15, 16 together form a corona. In operation, a voltage is applied between the first and second vapor suppressing electrodes 15, 16. The first and second vapor suppressing electrodes 15, 16 are positioned such that electrically conductive vapor, formed by (partial) evaporation of the electrically conductive fluid at the fluid surface 11 passes the corona. The electrically charged particles move to one of the electrodes; positively charged particles, such as cations, move to the second vapor suppressing electrode 16 (the anode) and negatively charged particles, such as anions and electrons, move to the first vapor suppressing electrode 15 (cathode). As a consequence, a electric current is generated between the first and second vapor suppressing electrodes. However, due to recombination of positively and negatively charged particles, neutral particles may be formed. The corona comprises a highly curved electrode (the first vapor suppressing electrode 15 as shown in FIG. 4). In the proximity of this highly curved electrode, a potential gradient is formed. This potential gradient may result in the formation of a plasma. In other words, the corona may transform the neutral particles, formed by recombination, into charged particles. The charged particles may move to one of the first and second vapor suppressing electrodes 15, 16, thereby suppressing the vapor of the electrically conductive fluid.

Detailed embodiments of the present invention are disclosed herein; however, it is to be understood that the disclosed embodiments are merely exemplary of the invention, which can be embodied in various forms. Therefore, specific structural and functional details disclosed herein are not to be interpreted as limiting, but merely as a basis for the claims and as a representative basis for teaching one skilled in the art to variously employ the present invention in virtually and appropriately detailed structure. In particular, features presented and described in separate dependent claims may be applied in combination and any combination of such claims are herewith disclosed.

Further, the terms and phrases used herein are not intended to be limiting; but rather, to provide an understandable description of the invention. The terms "a" or "an", as used herein, are defined as one or more than one. The term plurality, as used herein, is defined as two or more than two. The term another, as used herein, is defined as at least a second or more. The terms including and/or having, as used herein, are defined as comprising (i.e., open language).

The invention claimed is:

1. A device for ejecting droplets of an electrically conductive fluid, the device comprising:
   a fluid chamber body defining a fluid chamber and having an orifice extending from the fluid chamber to an outer surface of the fluid chamber body and the fluid chamber being adapted to comprise the electrically conductive fluid;
   an actuation device configured to eject a droplet of the electrically conductive fluid from the fluid chamber and through the orifice; and
   a vapor suppressing device configured to suppress vapor of the electrically conductive fluid, said vapor suppressing device comprising a vapor suppressing electrode, the vapor suppressing electrode being adapted to provide a direct voltage,
   wherein the actuation device comprises an actuating electrode for actuating the electrically conductive fluid and wherein the actuation device further comprise a magnet for providing a magnetic field in at least a art of the electrically conductive fluid.

2. The device for ejecting droplets of an electrically conductive fluid according to claim 1, wherein the electrically conductive fluid comprises a molten metal or a molten semiconductor.

3. The device for ejecting droplets of an electrically conductive fluid according to claim 1, wherein the device further comprises a heating for device configured to heat the electrically conductive fluid.

4. The device for ejecting droplets of an electrically conductive fluid according to claim 1, wherein the device further comprises means for applying an alternating voltage, said means for applying an alternating voltage being configured to, in operation, provide an alternating voltage over the vapor of the electrically conductive fluid for suppressing said vapor of the electrically conductive fluid.

5. The device for ejecting droplets of an electrically conductive fluid according to claim 1, wherein the vapor suppressing electrode is configured to, in operation, float on a fluid surface of the electrically conductive fluid.

6. The device for ejecting droplets of an electrically conductive fluid according to claim 1, wherein the vapor suppressing electrode is a sharp cathode.

7. The device according to claim 6, wherein the vapor suppressing device further comprises a corona.

8. The device according to claim 1, wherein the device further comprises a filter configured to filter the vapor of the electrically conductive fluid.

9. A vapor suppressing device for suppressing vapors of an electrically conductive fluid, the vapor suppressing device comprising a vapor suppressing electrode, the vapor suppressing device being adapted to be incorporated into a device for ejecting droplets of an electrically conductive fluid, the device for ejecting droplets of an electrically conductive fluid comprising:
   a fluid chamber body defining a fluid chamber and having an orifice extending from the fluid chamber to an outer surface of the fluid chamber body and the fluid chamber being adapted to comprise the electrically conductive fluid; and
   an actuation device configured to eject a droplet of the electrically conductive fluid from the fluid chamber and through the orifice,
   wherein the actuation device comprises an actuating electrode for actuating the electrically conductive fluid and wherein the actuation device further comprise a magnet for providing a magnetic field in at least a part of the electrically conductive fluid.

10. A method for suppressing vapor of an electrically conductive fluid in a device for ejecting droplets of an electrically conductive fluid, the device comprising
    a fluid chamber body defining a fluid chamber and having an orifice extending from the fluid chamber to an outer surface of the fluid chamber body and the fluid chamber being adapted to comprise the electrically conductive fluid;
    a vapor suppressing device configured to suppress vapor of the electrically conductive fluid, said vapor suppressing device comprising a vapor suppressing electrode; and
    an actuation device configured to eject a droplet of the electrically conductive fluid from the fluid chamber and through the orifice,
    wherein the actuation device comprises an actuating electrode for actuating the electrically conductive fluid and wherein the actuation device further comprise a magnet for providing a magnetic field in at least a part of the electrically conductive fluid,
    the method comprising the steps of:
    a) supplying the electrically conductive fluid to the fluid chamber of the device;
    b) applying a direct voltage to the vapor suppressing electrode for suppressing the vapor of the electrically conductive fluid.

11. The method according to claim 10, wherein step a) is preceded by the step of: supplying a solid material to the device, said solid material, upon melting, forming the electrically conductive fluid.

12. The method according to claim 10, wherein the method further comprises: c) heating the electrically conductive fluid.

13. The method according to claim 10, the method further comprising: d) applying an alternating voltage over the vapor of the electrically conductive fluid.

14. The method according to claim 10, wherein the method further comprises: e) filtering the vapor of the electrically conductive fluid using a filtering device.

* * * * *